(12) United States Patent
Oren et al.

(10) Patent No.: US 12,474,533 B2
(45) Date of Patent: Nov. 18, 2025

(54) ELECTRONIC MODULES FOR CO-PACKAGED OPTICS AND COPPER PACKAGES

(71) Applicant: Mellanox Technologies, Ltd., Yokneam (IL)

(72) Inventors: Amit Oren, Ramat Hasharon (IL); Barak Freedman, Binyamina (IL); Casper Dietrich, Roskilde (DK)

(73) Assignee: Mellanox Technologies, Ltd., Yokneam (IL)

( * ) Notice: Subject to any disclaimer, the term of this patent is extended or adjusted under 35 U.S.C. 154(b) by 204 days.

(21) Appl. No.: 18/198,890

(22) Filed: May 18, 2023

(65) Prior Publication Data
US 2024/0385400 A1   Nov. 21, 2024

(51) Int. Cl.
*H04B 10/00* (2013.01)
*G02B 6/42* (2006.01)
*H01L 23/00* (2006.01)
*H01L 23/498* (2006.01)

(52) U.S. Cl.
CPC .......... *G02B 6/4284* (2013.01); *G02B 6/4279* (2013.01); *G02B 6/428* (2013.01); *H01L 23/49816* (2013.01); *H01L 24/81* (2013.01)

(58) Field of Classification Search
CPC .... G02B 6/4284; G02B 6/4279; G02B 6/428; H01L 23/49816; H01L 24/81
See application file for complete search history.

(56) References Cited

U.S. PATENT DOCUMENTS

| | | | | |
|---|---|---|---|---|
| 5,282,111 A * | 1/1994 | Hopfer | ................. | H05K 7/1084 |
| | | | | 174/16.3 |
| 6,847,529 B2 * | 1/2005 | Dibene, II | ............ | H01L 23/433 |
| | | | | 257/E23.09 |
| 7,489,514 B2 * | 2/2009 | Hamasaki | ............ | G02B 6/4292 |
| | | | | 361/801 |
| 10,365,445 B2 * | 7/2019 | Badihi | ................. | G02B 6/4452 |
| 10,681,832 B1 * | 6/2020 | Leigh | ................... | H05K 1/0274 |

(Continued)

OTHER PUBLICATIONS

Seyedi, A., pending U.S. Appl. No. 18/088,877, filed Dec. 27, 2022.
(Continued)

*Primary Examiner* — Agustin Bello
(74) *Attorney, Agent, or Firm* — Alston & Bird LLP

(57) ABSTRACT

Electronic devices, electronic modules, and methods for manufacturing electronic devices and/or electronic modules are described herein. Some embodiments of the present invention may be directed to an electronic module that includes a multi-chip module (MCM) substrate having a first surface configured to be connected to a system printed circuit board and a second surface defining a central portion and a peripheral portion. The electronic module may include a main die positioned on the central portion of the second surface of the MCM substrate and in electrical communication with electrical traces of the MCM substrate. The electronic module may include MCM sockets positioned on the peripheral portion of the MCM substrate, where each MCM socket is configured to engage and support a mezzanine package substrate such that a main portion of the mezzanine package substrate extends beyond the peripheral portion of the MCM substrate.

20 Claims, 9 Drawing Sheets

(56) References Cited

U.S. PATENT DOCUMENTS

| | | | | |
|---|---|---|---|---|
| 10,866,376 | B1* | 12/2020 | Ghiasi | G02B 6/4292 |
| 11,178,473 | B1* | 11/2021 | Nagarajan | H04B 10/40 |
| 11,391,897 | B2* | 7/2022 | Patel | G02B 6/4284 |
| 11,432,056 | B1* | 8/2022 | Doerr | G02B 6/421 |
| 11,496,218 | B1 | 11/2022 | Mentovich et al. | |
| 11,503,732 | B1* | 11/2022 | Costello | H01R 13/05 |
| 11,719,898 | B2* | 8/2023 | Nagarajan | G02B 6/4257 |
| | | | | 398/164 |
| 2004/0218372 | A1* | 11/2004 | Hamasaki | H05K 1/0263 |
| | | | | 361/767 |
| 2006/0038287 | A1* | 2/2006 | Hamasaki | G02B 6/3817 |
| | | | | 257/726 |
| 2007/0258683 | A1* | 11/2007 | Rolston | G02B 6/43 |
| | | | | 385/88 |
| 2014/0203175 | A1* | 7/2014 | Kobrinsky | G02B 6/4214 |
| | | | | 250/214.1 |
| 2015/0003841 | A1* | 1/2015 | McLaren | G02B 6/43 |
| | | | | 398/141 |
| 2016/0216445 | A1* | 7/2016 | Thacker | G02B 6/4219 |
| 2018/0120525 | A1* | 5/2018 | Leigh | G02B 6/4269 |
| 2018/0306990 | A1* | 10/2018 | Badihi | G02B 6/4448 |
| 2019/0033542 | A1* | 1/2019 | Epitaux | G02B 6/4226 |
| 2019/0086618 | A1* | 3/2019 | Shastri | H01R 12/721 |
| 2019/0391350 | A1* | 12/2019 | Evans | G02B 6/4292 |
| 2021/0044356 | A1* | 2/2021 | Aboagye | G02B 6/423 |
| 2021/0048587 | A1* | 2/2021 | Denoyer | H01L 24/81 |
| 2021/0119361 | A1* | 4/2021 | Perry | H01R 12/7047 |
| 2021/0194164 | A1* | 6/2021 | Epitaux | G02B 6/4246 |
| 2021/0263236 | A1* | 8/2021 | Janta-Polczynski | |
| | | | | G02B 6/3885 |
| 2021/0274673 | A1* | 9/2021 | Blackburn | H01L 23/4006 |
| 2021/0288035 | A1* | 9/2021 | Liljeberg | G02B 6/4268 |
| 2022/0151095 | A1* | 5/2022 | Blackburn | H05K 7/1061 |
| 2022/0196933 | A1* | 6/2022 | Patel | G02B 6/4278 |
| 2022/0377907 | A1 | 11/2022 | Mentovich et al. | |
| 2022/0377912 | A1 | 11/2022 | Atias et al. | |
| 2023/0007788 | A1 | 1/2023 | Atias et al. | |
| 2023/0075607 | A1* | 3/2023 | Achkir | H01L 23/5383 |
| 2023/0154825 | A1* | 5/2023 | Tong | H01L 23/3107 |
| | | | | 257/659 |
| 2023/0197635 | A1* | 6/2023 | Patel | H01L 21/4871 |
| | | | | 257/668 |
| 2023/0204879 | A1* | 6/2023 | Kim | G02B 6/4249 |
| | | | | 385/33 |
| 2023/0375793 | A1* | 11/2023 | Winzer | G02B 6/428 |
| 2024/0077669 | A1* | 3/2024 | Yu | G02B 6/4214 |
| 2024/0337799 | A1* | 10/2024 | Ravichandran | G02B 6/4238 |
| 2024/0385400 | A1* | 11/2024 | Oren | H01L 23/49816 |

OTHER PUBLICATIONS

Yang, X. et al., pending U.S. Appl. No. 17/886,618, filed Aug. 12, 2022.

Mentovich, E. et al., pending U.S. Appl. No. 17/660,348, filed Apr. 22, 2022.

Vegas Olmos, J. J. et al., pending U.S. Appl. No. 17/675,669, filed Feb. 18, 2022.

Steinberg, O. et al., pending U.S. Appl. No. 18/200,314, filed May 22, 2023.

* cited by examiner

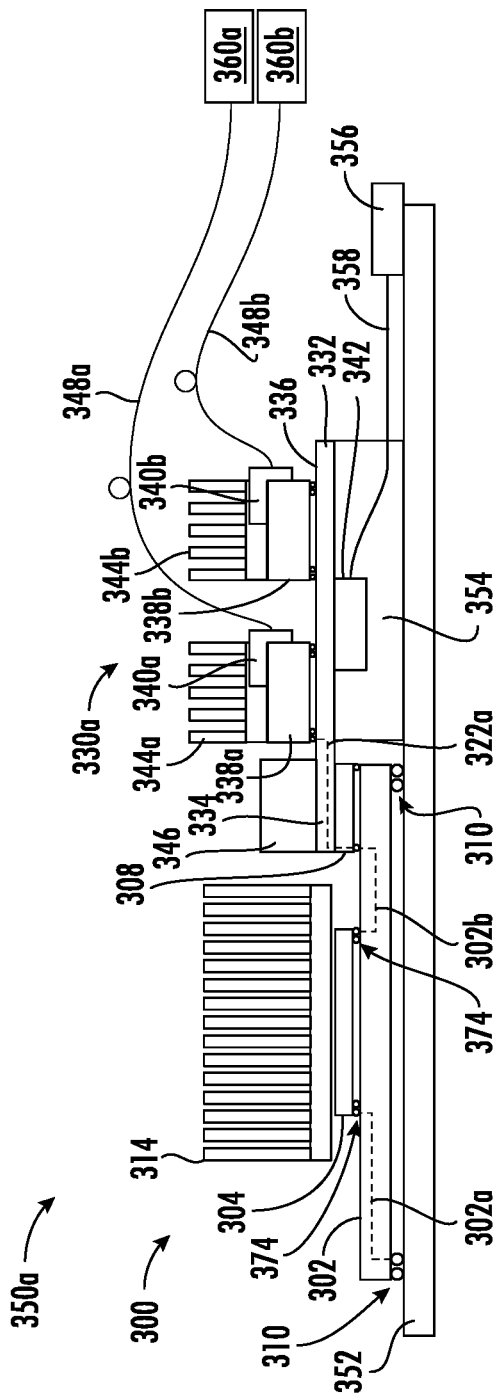
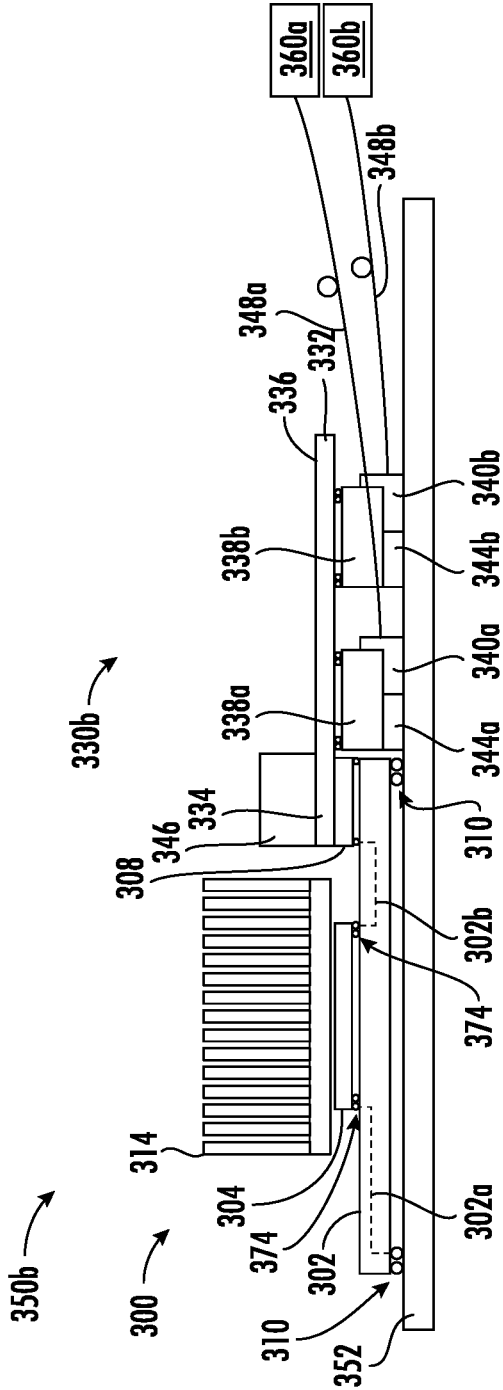
FIG. 3A
FIG. 3B

500 ↘

┌─────────────────────────────────────────────────────────────────────────────┐
│ PROVIDE A MULTI-CHIP MODULE (MCM) INCLUDING (I) AN MCM SUBSTRATE HAVING A FIRST │
│ SURFACE AND A SECOND SURFACE OPPOSITE THE FIRST SURFACE, WHERE THE SECOND SURFACE │
│ DEFINES A CENTRAL PORTION AND A PERIPHERAL PORTION, AND WHERE THE MCM SUBSTRATE ├─502
│ INCLUDES ELECTRICAL TRACES, AND (II) A MAIN DIE POSITIONED ON THE CENTRAL PORTION │
│ OF THE SECOND SURFACE AND IN ELECTRICAL COMMUNICATION WITH THE ELECTRICAL TRACES │
└─────────────────────────────────────────────────────────────────────────────┘
                                       ↓
┌─────────────────────────────────────────────────────────────────────────────┐
│ DISPOSE A PLURALITY OF MCM SOCKETS ON THE PERIPHERAL PORTION OF THE MCM     │
│ SUBSTRATE, WHERE EACH MCM SOCKET OF THE PLURALITY OF MCM SOCKETS IS IN ELECTRICAL ├─504
│ COMMUNICATION WITH THE ELECTRICAL TRACES OF THE MCM SUBSTRATE               │
└─────────────────────────────────────────────────────────────────────────────┘
                                       ↓
┌─────────────────────────────────────────────────────────────────────────────┐
│ MECHANICALLY AND ELECTRICALLY CONNECT THE FIRST SURFACE OF THE MCM SUBSTRATE TO │
│ A SYSTEM PRINTED CIRCUIT BOARD (PCB)                                        ├─506
└─────────────────────────────────────────────────────────────────────────────┘
                                       ↓
┌─────────────────────────────────────────────────────────────────────────────┐
│ ENGAGE A MEZZANINE PACKAGE WITH A FIRST MCM SOCKET OF THE PLURALITY OF MCM  │
│ SOCKETS, WHERE THE MEZZANINE PACKAGE INCLUDES A MEZZANINE PACKAGE SUBSTRATE │
│ INCLUDING (I) A CONNECTOR PORTION FOR ENGAGING THE FIRST MCM SOCKET AND (II) ├─508
│ A MAIN PORTION EXTENDING BEYOND THE PERIPHERAL PORTION OF THE MCM SUBSTRATE, │
│ WHERE THE MAIN PORTION IS CONFIGURED TO SUPPORT ONE OR MORE DEVICES IN      │
│ ELECTRICAL COMMUNICATION WITH THE MCM SUBSTRATE VIA THE FIRST MCM SOCKET    │
└─────────────────────────────────────────────────────────────────────────────┘
                                       ↓
┌─────────────────────────────────────────────────────────────────────────────┐
│ ATTACH THE MCM AND THE MEZZANINE PACKAGE TO THE SYSTEM PCB WITH A MECHANICAL ├─510
│ ENCLOSURE                                                                   │
└─────────────────────────────────────────────────────────────────────────────┘

FIG. 5

ELECTRONIC MODULES FOR CO-PACKAGED OPTICS AND COPPER PACKAGES

FIELD OF THE INVENTION

The present invention relates to electronic modules for co-packaged optics and copper packages and methods of making the same.

BACKGROUND

As bandwidth requirements increase, the number of high-speed channels running to and from ASICs of electronic modules increase along with the power consumption of the electronic modules. To increase the number of high-speed channels and accommodate the increased power consumption, electronic module designers increase the number of electrical connections provided by ball grid arrays of the electronic modules, which increases the overall substrate size of the electronic modules.

SUMMARY

The following presents a simplified summary of one or more embodiments of the present invention, in order to provide a basic understanding of such embodiments. This summary is not an extensive overview of all contemplated embodiments and is intended to neither identify key or critical elements of all embodiments nor delineate the scope of any or all embodiments. This summary presents some concepts of one or more embodiments of the present invention in a simplified form as a prelude to the more detailed description that is presented later.

In one aspect, the present invention is directed to an electronic module including a multi-chip module (MCM) substrate, a main die, and a plurality of MCM sockets. The MCM substrate may have (i) a first surface including a ball grid array (BGA) configured to be connected to a system printed circuit board (PCB) and (ii) a second surface opposite the first surface, where the second surface defines a central portion and a peripheral portion, and where the MCM substrate includes electrical traces. The main die may be positioned on the central portion of the second surface of the MCM substrate and may be in electrical communication with the electrical traces. The plurality of MCM sockets may be positioned on the peripheral portion of the MCM substrate, where each MCM socket of the plurality of MCM sockets is in electrical communication with the electrical traces of the MCM substrate. The plurality of MCM sockets may be configured to engage and support a mezzanine package substrate via a connector portion of the mezzanine package substrate such that a main portion of the mezzanine package substrate extends beyond the peripheral portion of the MCM substrate. The plurality of MCM sockets may be configured to electrically connect the mezzanine package substrate to the main die via at least one of the electrical traces of the MCM substrate.

In some embodiments, each socket of the plurality of MCM sockets may include a socket frame defining a peripheral access opening that may be configured to allow the main portion of the mezzanine package substrate to extend beyond an edge of the MCM socket. Additionally, or alternatively, each socket of the plurality of MCM sockets may include a socket pin array within the socket frame and configured to engage the second surface of the MCM substrate and electrically connect the mezzanine package substrate to the main die via at least one of the electrical traces of the MCM substrate. In some embodiments, a pitch of the BGA may be greater than a pitch of the socket pin array.

In some embodiments, the electronic module may include an attachment member configured to be applied to a connector portion of at least one mezzanine package substrate so as to mechanically secure the at least one of the mezzanine package substrate with respect to a corresponding one of the plurality of MCM sockets, where the attachment member is configured to be attached to the system PCB. Additionally, or alternatively, the attachment member may be a contiguous element configured to simultaneously secure a plurality of connector portions of mezzanine package substrates in the corresponding plurality of MCM sockets.

In some embodiments, the plurality of MCM sockets may be configured to electrically connect high speed signal pins and ground isolation pins of mezzanine package substrates to the MCM.

In another aspect, the present invention is directed to an electronic module including a multi-chip module (MCM) and a mezzanine package. The MCM may include an MCM substrate having (i) a first surface including a ball grid array (BGA) configured to be connected to a system printed circuit board (PCB) and (ii) a second surface opposite the first surface, where the second surface defines a central portion and a peripheral portion, and where the MCM substrate includes electrical traces. The MCM may also include a main die positioned on the central portion of the MCM substrate and in electrical communication with the electrical traces. The MCM may also include a plurality of MCM sockets positioned on the peripheral portion of the MCM substrate, where each MCM socket of the plurality of MCM sockets is in electrical communication with the electrical traces of the MCM substrate. The mezzanine package may include a mezzanine package substrate including (i) a connector portion engaged and supported by a first MCM socket of the plurality of MCM sockets and (ii) a main portion extending beyond the peripheral portion of the MCM substrate. The main portion of the mezzanine package substrate may be configured to support one or more devices and electrically connect the one or more devices with the MCM substrate via the first MCM socket.

In some embodiments, the mezzanine package may be a co-packaged copper (CPC) package, where the one or more devices include one or more radio-frequency copper cable connectors. Additionally, or alternatively, the mezzanine package may be a co-packaged optics (CPO) package, where the one or more devices include one or more optical devices.

In some embodiments, the mezzanine package may be a first mezzanine package, the mezzanine package substrate may be a first mezzanine package substrate, and the electronic module may include a second mezzanine package. The second mezzanine package may include a second mezzanine package substrate including (i) a connector portion engaged and supported by a second MCM socket of the plurality of MCM sockets and (ii) a main portion extending beyond the peripheral portion of the MCM substrate, where the main portion is configured to support one or more devices and electrically connect the one or more devices with the MCM substrate via the second MCM socket. Additionally, or alternatively, the first mezzanine package may be a CPC package, and the second mezzanine package may be a CPO package.

In some embodiments, the mezzanine package may be a CPO package including a power connection positioned on the main portion of the mezzanine package substrate, where the power connection is configured to receive power for the CPO package from the system PCB.

In some embodiments, the mezzanine package may be a CPO package including an input/output connection positioned on the main portion of the mezzanine package substrate, where the input/output connection is configured to transmit input/output signals between the CPO package and the system PCB.

In some embodiments, the mezzanine package may be a CPO package, the main portion of the mezzanine package substrate may be configured to support the one or more devices on a first surface of the mezzanine package substrate, and the first surface of the mezzanine package substrate may be disposed adjacent the second surface of the MCM substrate. Additionally, or alternatively, the electronic module may include a support member configured to be positioned between the main portion of the mezzanine package substrate and the system PCB and to support the main portion of the mezzanine package substrate with respect to the system PCB.

In some embodiments, the mezzanine package may be a CPO package, and the one or more devices may include a plurality of photonic integrated circuits (PICs). Additionally, or alternatively, the CPO package may include, for each PIC of the plurality of PICs, an optical connector.

In yet another aspect, the present invention is directed to a method of assembling an electronic device. The method may include providing a multi-chip module (MCM) including an MCM substrate and a main die. The MCM substrate may have a first surface and a second surface opposite the first surface, where the second surface defines a central portion and a peripheral portion, and where the MCM substrate includes electrical traces. The main die may be positioned on the central portion of the second surface and may be in electrical communication with the electrical traces. The method may include disposing a plurality of MCM sockets on the peripheral portion of the MCM substrate, where each MCM socket of the plurality of MCM sockets is in electrical communication with the electrical traces of the MCM substrate. The method may include mechanically and electrically connecting the first surface of the MCM substrate to a system printed circuit board (PCB). The method may include engaging a mezzanine package with a first MCM socket of the plurality of MCM sockets. The mezzanine package may include a mezzanine package substrate including (i) a connector portion for engaging the first MCM socket and (ii) a main portion extending beyond the peripheral portion of the MCM substrate. The main portion may be configured to support one or more devices in electrical communication with the MCM substrate via the first MCM socket.

In some embodiments, mechanically and electrically connecting the first surface of the MCM to the system PCB may include reflow soldering a ball grid array on the first surface of the MCM.

In some embodiments, engaging the mezzanine package with the first MCM socket may include applying an attachment member to the connector portion of the mezzanine package substrate and securing the attachment member to the system PCB, where the connector portion of the mezzanine package substrate is disposed between the attachment member and the first MCM socket.

In some embodiments, the mezzanine package may be a first mezzanine package, the mezzanine package substrate may be a first mezzanine package substrate, and the method may include engaging a second mezzanine package with a second MCM socket of the plurality of MCM sockets. The second mezzanine package may include a second mezzanine package substrate including (i) a connector portion for engaging the second MCM socket and (ii) a main portion extending beyond the peripheral portion of the MCM substrate. The main portion may be configured to support one or more devices in electrical communication with the MCM substrate via the second MCM socket.

The features, functions, and advantages that have been discussed may be achieved independently in various embodiments of the present invention or may be combined with yet other embodiments, further details of which may be seen with reference to the following description and drawings.

BRIEF DESCRIPTION OF THE DRAWINGS

Figure 1A:
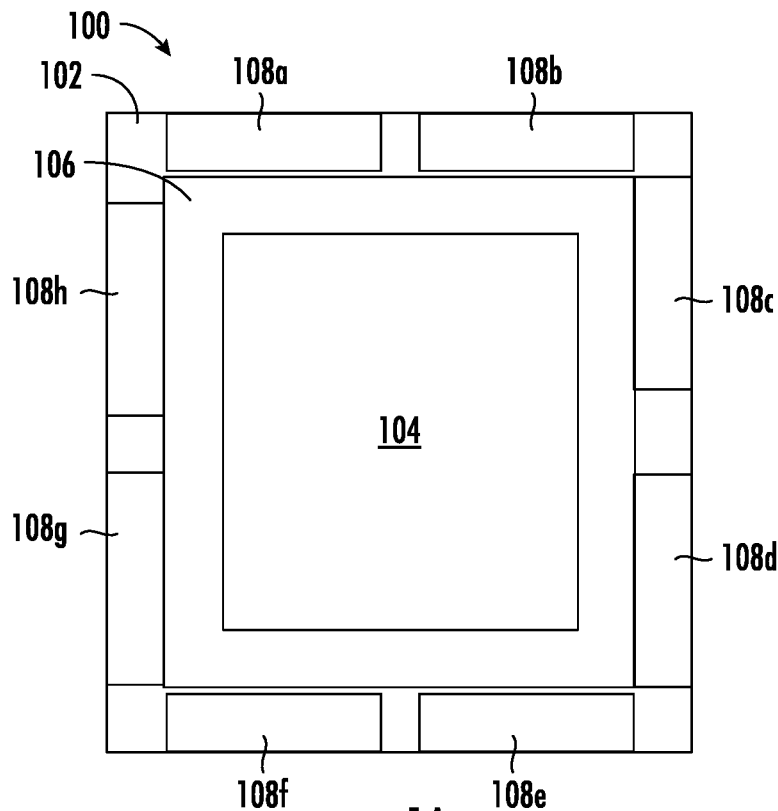
Figure 1B:
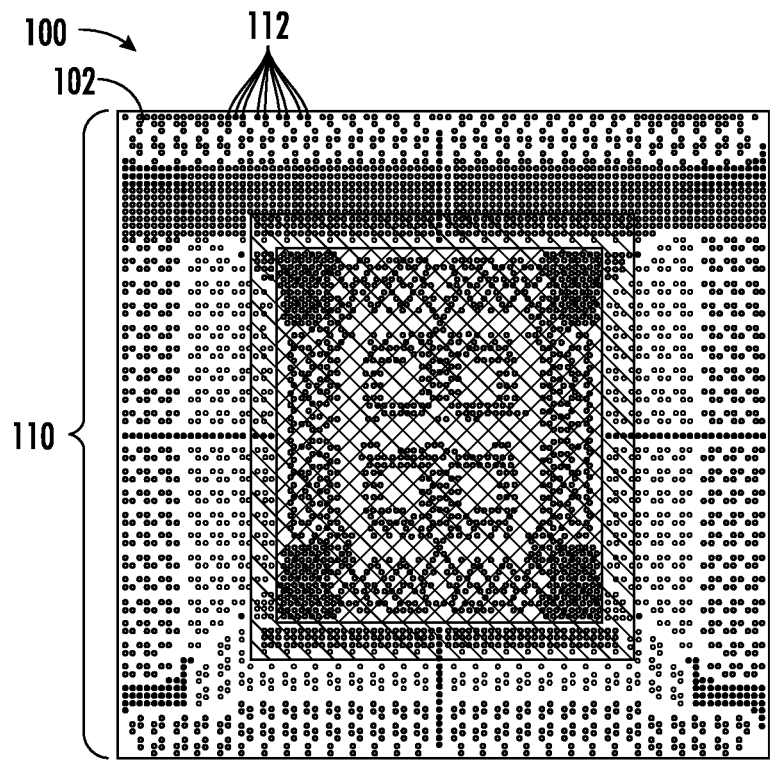
Figure 1C:
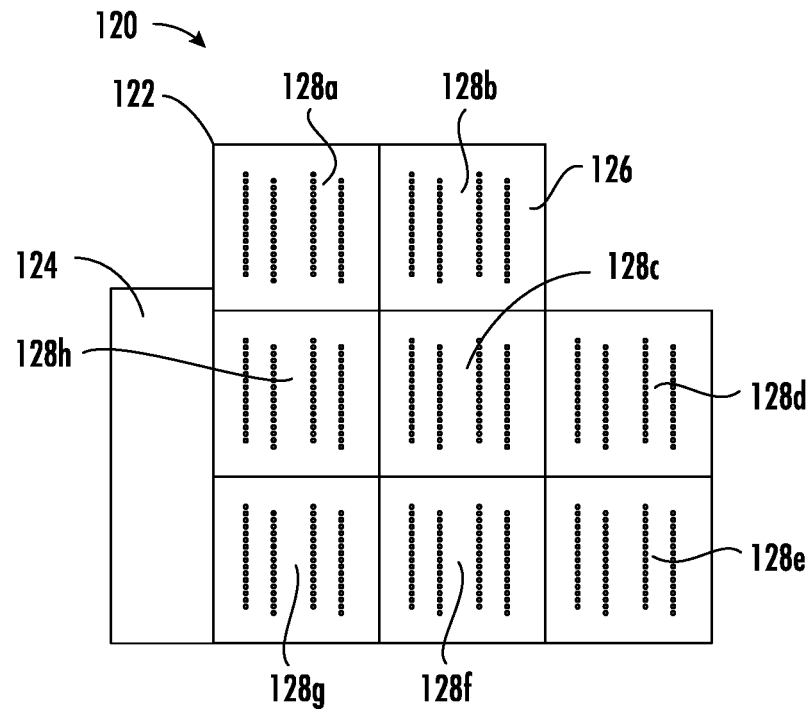
Figure 1D:
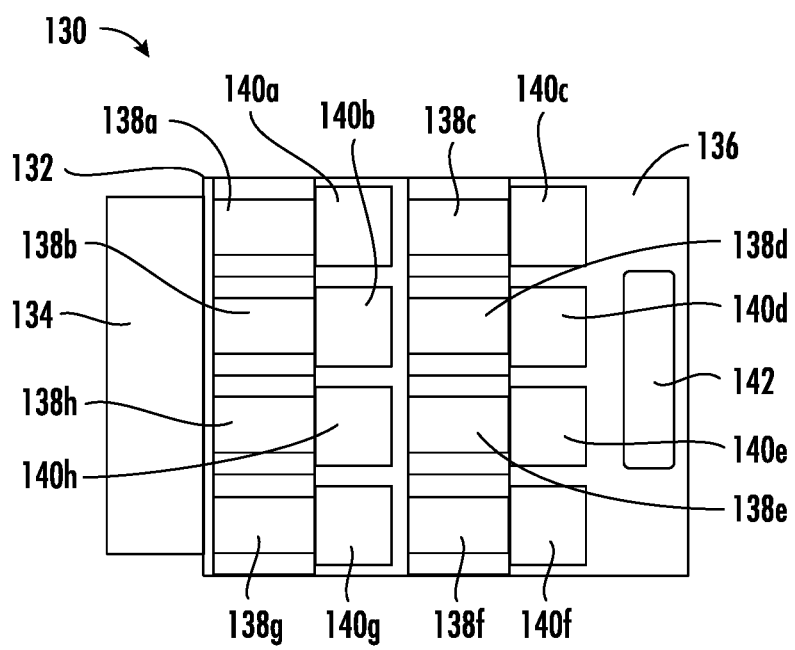
Figure 1E:
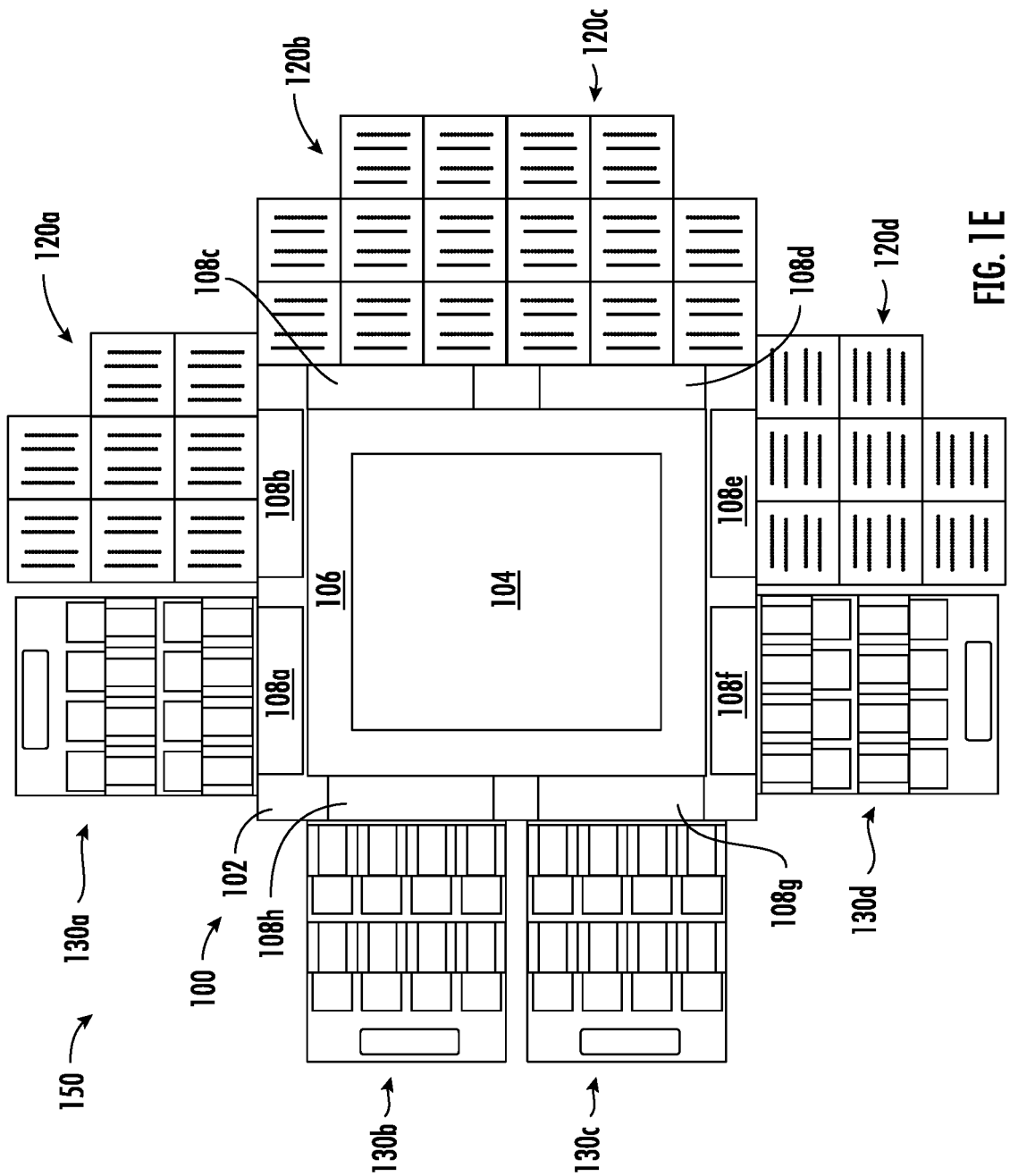
Figure 1F:
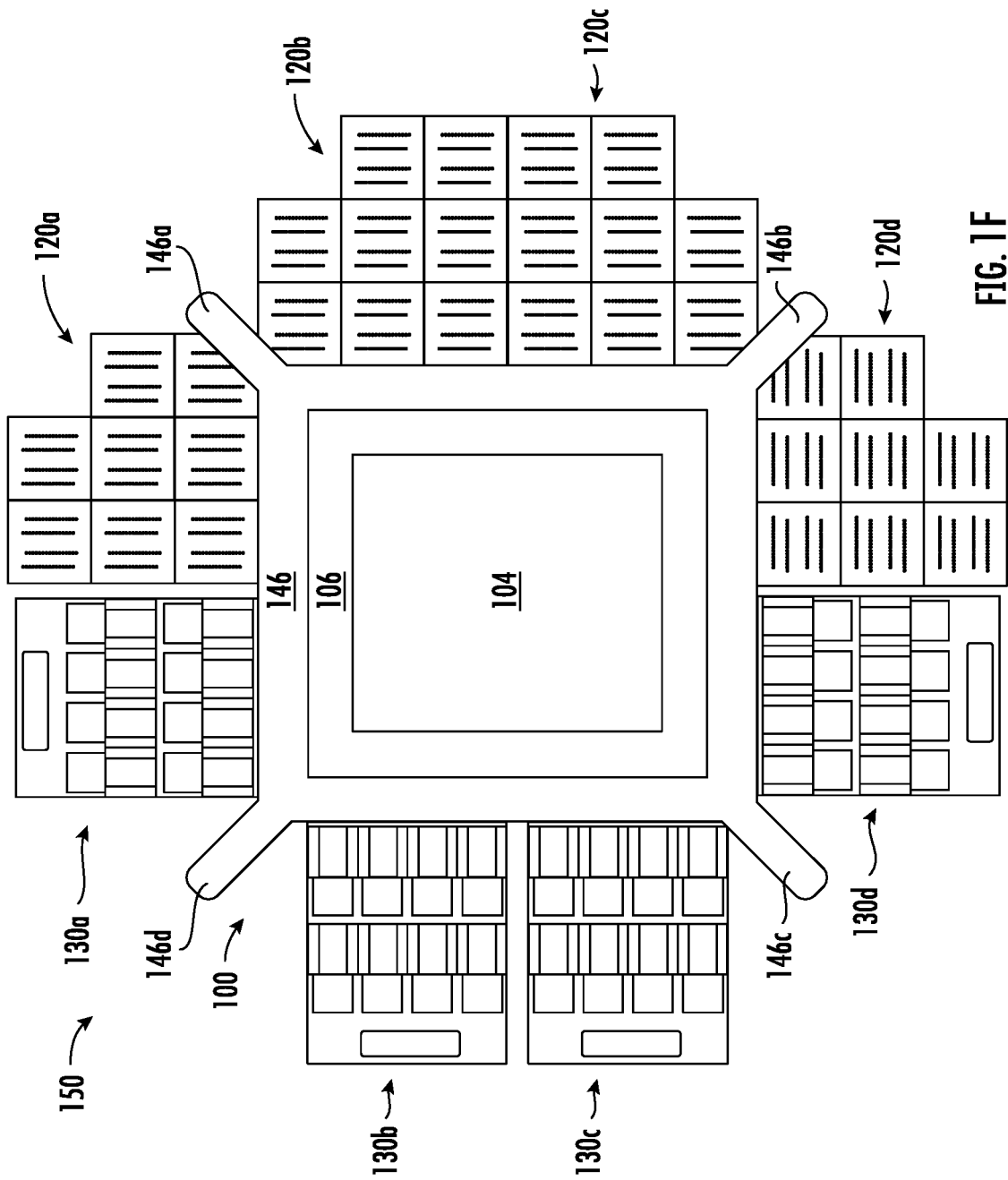
Figure 1G:
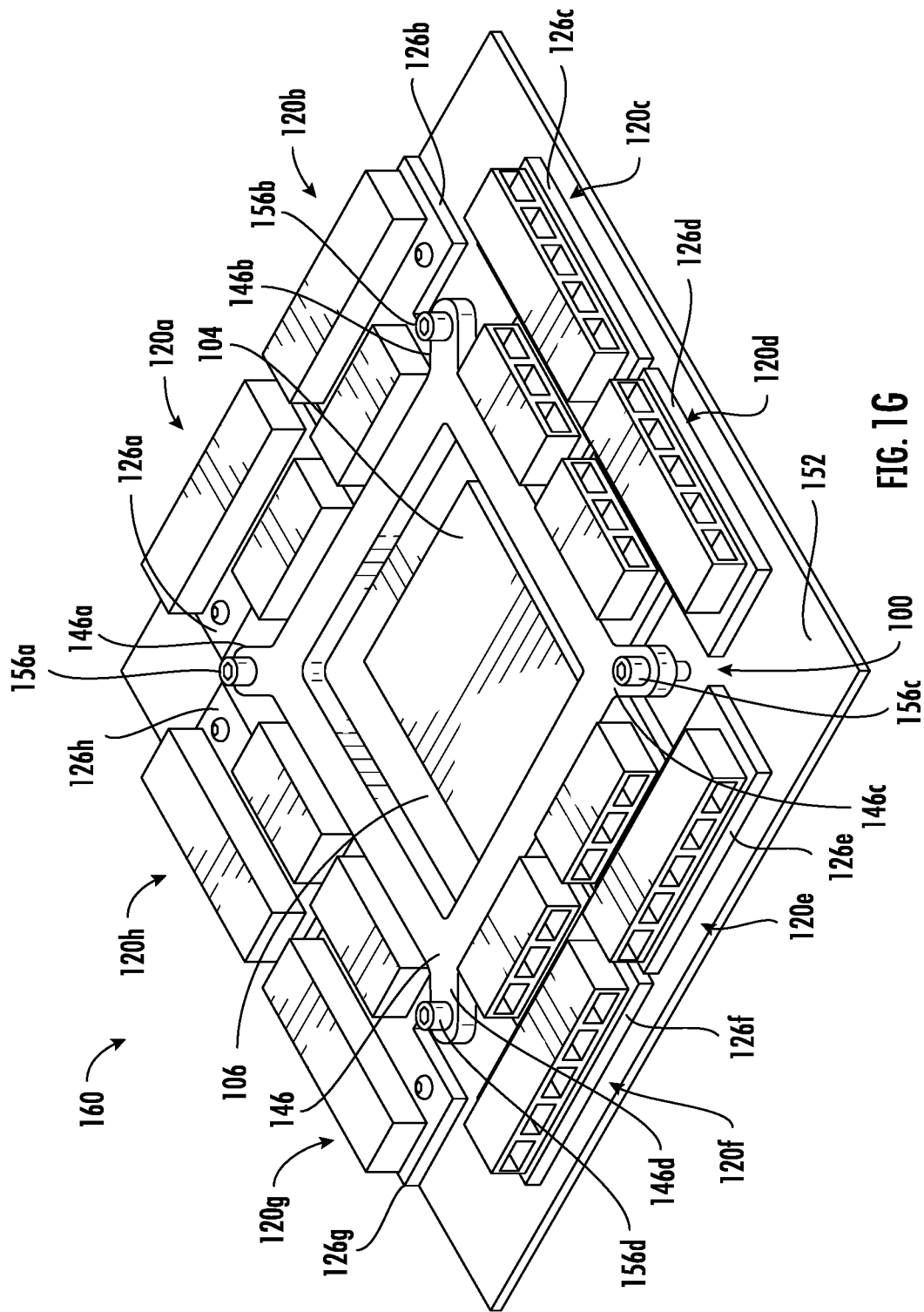
Figure 2:
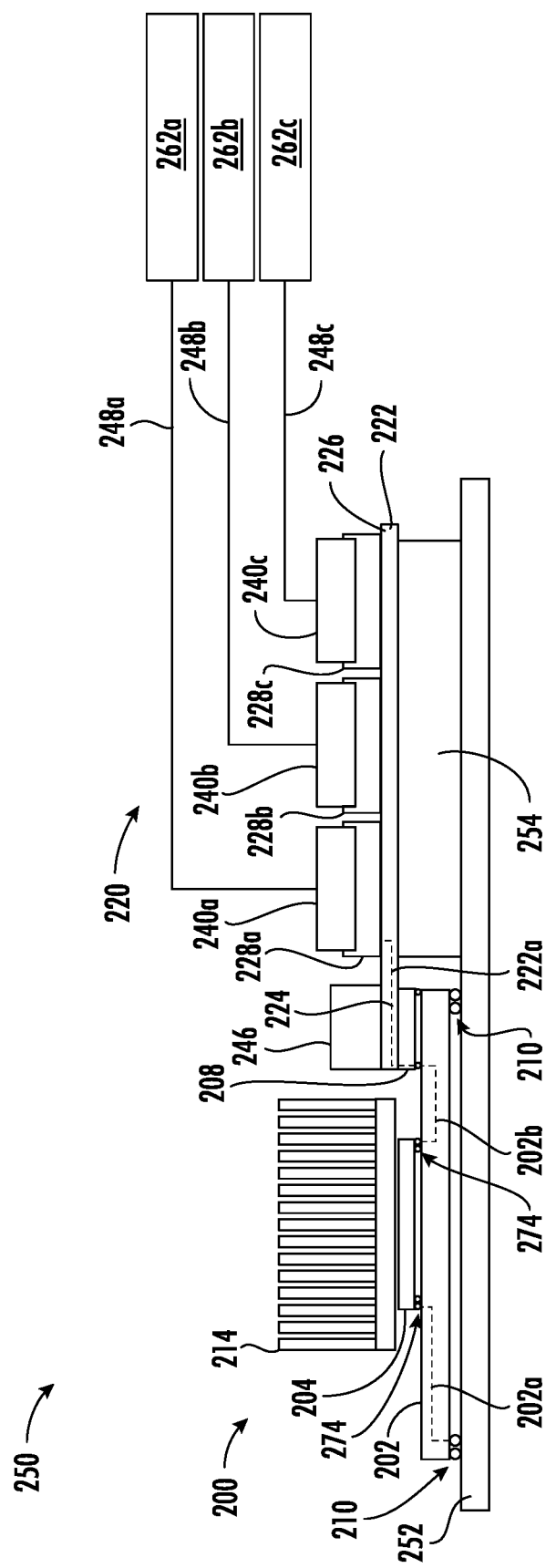
Figure 4A:
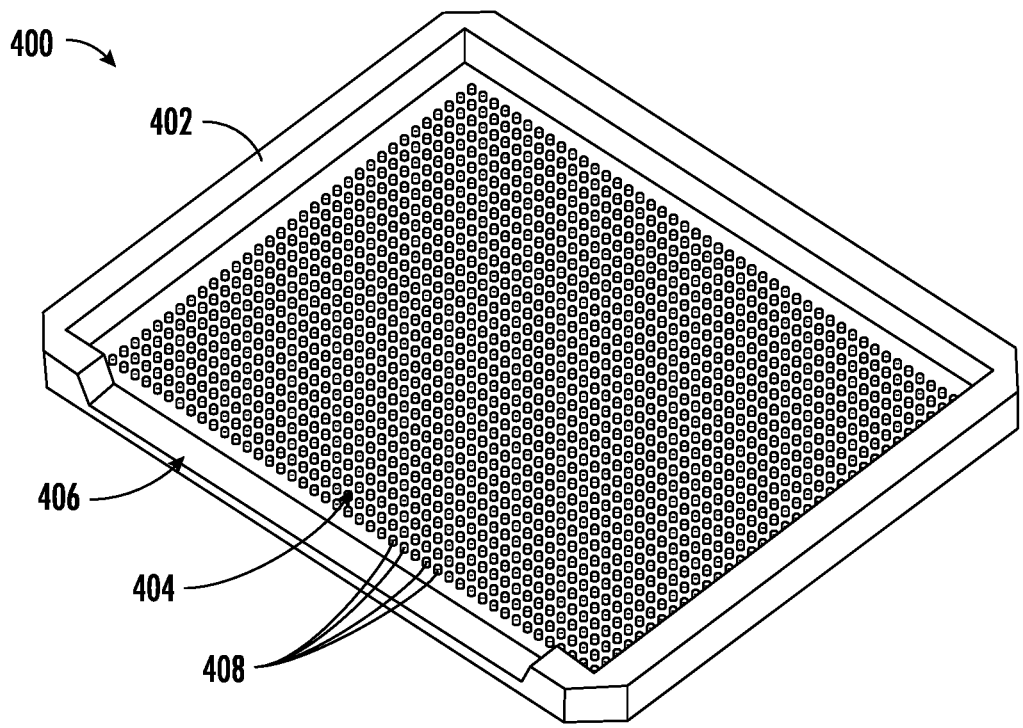
Figure 4B:
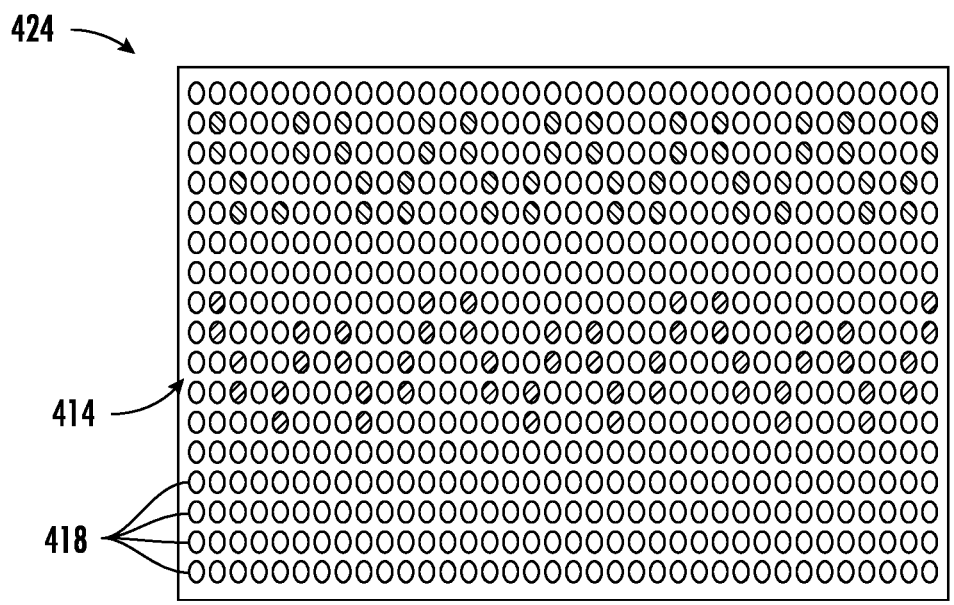

Having thus described embodiments of the invention in general terms, reference will now be made the accompanying drawings, wherein:

FIG. 1A is a top view of a multi-chip module (MCM), in accordance with an embodiment of the invention;

FIG. 1B is a bottom view of the MCM of FIG. 1A;

FIG. 1C is a top view of a co-packaged copper (CPC) package, in accordance with an embodiment of the invention;

FIG. 1D is a top view of a co-packaged optics (CPO) package, in accordance with an embodiment of the invention;

FIG. 1E is a top view of an electronic module including the MCM of FIG. 1A, multiple CPC packages, and multiple CPO packages, in accordance with an embodiment of the invention;

FIG. 1F is a top view of the electronic module of FIG. 1E and an attachment member, in accordance with an embodiment of the invention;

FIG. 1G is a perspective view of an electronic device including the MCM of FIG. 1A, multiple CPC packages, and an attachment member, in accordance with an embodiment of the invention;

FIG. 2 is a cross-sectional view of an electronic device including an MCM and a CPC package, in accordance with an embodiment of the invention;

FIG. 3A is a cross-sectional view of an electronic device including an MCM and a CPO package, in accordance with an embodiment of the invention;

FIG. 3B is a cross-sectional view of an electronic device including an MCM and another CPO package, in accordance with an embodiment of the invention;

FIG. 4A is a perspective view of a socket for an MCM, in accordance with an embodiment of the invention;

FIG. 4B is a bottom view of a connector portion of a mezzanine package substrate, in accordance with an embodiment of the invention; and FIG. 5 is a flowchart illustrating a method of assembling an electronic device, in accordance with an embodiment of the invention.

DETAILED DESCRIPTION OF EMBODIMENTS OF THE INVENTION

Embodiments of the present invention will now be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein. Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Furthermore, when it is said herein that something is "based on" something else, it may be based on one or more other things as well. In other words, unless expressly indicated otherwise, as used herein "based on" means "based at least in part on" or "based at least partially on." Also, as used herein, the term "or" is intended to be inclusive when used in a series and may be used interchangeably with "and/or," unless explicitly stated otherwise (e.g., if used in combination with "either" or "only one of"). Like numbers refer to like elements throughout. No element, act, or instruction used herein should be construed as critical or essential unless explicitly described as such.

As noted above, as bandwidth requirements increase, the number of high-speed channels running to and from ASICs of electronic modules increase along with the power consumption of the electronic modules. To increase the number of high-speed channels and accommodate the increased power consumption, the number of electrical connections provided by ball grid arrays of the electronic modules may be increased, which in turn increases the overall substrate size of the electronic modules. However, increasing the substrate size of an electronic module presents production challenges, such as increased substrate manufacturing yields, substrate warpage, and associated printed circuit board (PCB) assembly and solderability challenges.

Some embodiments of the present invention are directed to a multi-chip module (MCM) with a centrally positioned main die and a plurality of peripherally positioned MCM sockets configured to mechanically receive and electrically connect mezzanine packages, which may include co-packaged optics (CPO) packages and co-packaged copper (CPC) packages. Each mezzanine package may include a package substrate including a connector portion that is configured to engage the MCM socket and a main portion extending beyond the periphery of the MCM substrate. The main portion of the mezzanine package may be configured to receive optical devices and/or integrated circuits, such as via mezzanine sockets, to allow connections to be made between the optical devices and/or integrated circuits/RF copper cable connectors and the main die of the MCM. Due to the extension of the mezzanine package beyond the periphery of the MCM substrate, the physical size of the MCM substrate may remain small to reduce cost and avoid the previously discussed production challenges, while allowing connections to a number of optical devices and integrated circuits via the mezzanine packages, which occupy the relatively inexpensive space around the periphery of the MCM substrate.

The substrate of the MCM may have a width and length of 90 millimeters or less and may include a ball grid array to connect to a system PCB. The MCM sockets connecting the mezzanine packages to the MCM substrate may include pin grid arrays having a pitch (e.g., 0.6 millimeters) that may be less than the pitch of the ball grid array connecting the MCM to the PCB (e.g., 1 millimeter). The MCM socket pins may include only high-speed signals and their respective ground isolations. Other input/output pins and power planes may be fed into the mezzanine package by a different connector directly from the system printed circuit board (PCB) instead of through the MCM substrate. For example, a CPO package may include a power connection to the system PCB (e.g., via a cable), rather than to the MCM. In some embodiments, the CPO package may be flipped such that its optical devices are on the bottom side of the CPO substrate (e.g., the same side as the electrical connection to the socket), thereby eliminating the need for traces running through the CPO substrate core and improving the signal integrity of the high-speed traces. Using such an MCM with preconfigured sockets and mezzanine packages also permits the MCM to support both CPO packages and CPC packages at the same time.

FIG. 1A is a top view of a multi-chip module (MCM) 100, in accordance with an embodiment of the invention, and FIG. 1B is a bottom view of the MCM of FIG. 1A. As shown in FIG. 1A, the MCM 100 may include an MCM substrate 102 and a main die 104 positioned on a central portion of a surface of the MCM substrate 102. In some embodiments, the MCM substrate 102 may include electrical traces (e.g., through a thickness the MCM substrate 102), and the main die 104 may be in electrical communication with the electrical traces.

As shown in FIG. 1A, the MCM 100 may include a component-free zone 106 (e.g., a component "keep out" zone) around the periphery of the main die 104. The component-free zone 106 may define a portion of the MCM substrate 102 on which no pads, sockets, vias, and/or other components are positioned (e.g., only traces may be permitted within the component-free zone 106). The component-free zone 106 may be established on the MCM substrate 102 to prevent electrical interference between components on the MCM substrate 102, to enable thermal dissipation (e.g., via a heatsink), and/or the like.

As shown in FIG. 1A, the MCM 100 may include a plurality of MCM sockets 108a-108h positioned on a peripheral portion of the surface of the MCM substrate 102 (e.g., outside of the component-free zone 106, between outer edges of the MCM substrate 102 and the main die 104 and/or the component-free zone 106, and/or the like). In some embodiments, each MCM socket of the plurality of MCM sockets 108a-108h may be in electrical communication with the electrical traces. As described herein with respect to FIGS. 1E-4B, each MCM socket of the plurality of MCM sockets 108a-108h may be configured to engage and support a mezzanine package substrate (e.g., of a CPO package or a CPC package) via a connector portion of the mezzanine package substrate such that a main portion of the mezzanine package substrate extends beyond the peripheral portion of the MCM substrate 102. Furthermore, each MCM socket of the plurality of MCM sockets 108a-108h may be configured to electrically connect a mezzanine package substrate to the main die 104 via at least one of the electrical traces of the MCM substrate 102. For example, the plurality of MCM sockets 108a-108h may be configured to electrically connect high speed signal pins, ground isolation pins, and/or other types of pins of the mezzanine packages to the MCM 100. In some embodiments, each MCM socket of the plurality of MCM sockets 108a-108h may be similar to a socket 400 as shown and described herein with respect to FIG. 4A.

As shown in FIG. 1B, the MCM 100 may also include a ball grid array (BGA) 110 on another surface of the MCM substrate 102 opposite the surface on which the main die 104 and/or the plurality of MCM sockets 108a-108h is positioned. The BGA 110 may be configured to be connected to a system PCB (e.g., as shown and described herein with respect to FIGS. 2-3B). For example, the MCM 100 and/or the MCM substrate 102 may be electrically and mechanically connected to the system PCB by reflow soldering the BGA 110. As shown in FIG. 1B, the BGA 110 may include a plurality of solder balls 112 configured to provide electrical and mechanical connections to the MCM 100 and/or the MCM substrate 102 (e.g., providing electrical connections to the electrical traces of the MCM substrate 102).

As will be appreciated by those of ordinary skill in the art in view of this disclosure, FIGS. 1A and 1B depict a simplified and/or representative design for an MCM, in accordance with an embodiment of the invention. For example, the MCM 100 may include fewer MCM sockets (e.g., seven, six, five, four, three, two, or even one MCM socket), more MCM sockets (e.g., nine, ten, eleven, twelve, or more MCM sockets), differently sized, shaped, and/or positioned MCM sockets, while still engaging and supporting mezzanine packages extending beyond the peripheral portion of the MCM substrate 102. As another example, the MCM 100 may include one or more MCM sockets similar to the plurality of MCM sockets 108a-108h as well as one or more conventional MCM sockets configured to electrically connect to a CPO package or a CPC package that does not extend beyond the peripheral portion of the MCM substrate 102. As yet another example, the MCM substrate 102, the main die 104, and/or the component-free zone 106 may have a different size and/or shape as compared to that shown in FIGS. 1A and 1B.

FIG. 1C is a top view of a co-packaged copper (CPC) package 120, in accordance with an embodiment of the invention. In this regard, the CPC package 120 may be a type of mezzanine package referred to with respect to FIGS. 1A and 1B as being electrically connected to and supported by one of the MCM sockets 108a-108h of the MCM 100. As shown in FIG. 1C, the CPC package 120 may include a CPC substrate 122 (e.g., a mezzanine package substrate) including a connector portion 124 and a main portion 126. In some embodiments, the connector portion 124 may be configured to be engaged and supported by an MCM socket of an MCM (e.g., one of the MCM sockets 108a-108h of the MCM 100 of FIGS. 1A and 1B). For example, the connector portion 124 may be similar to a connector portion 424 shown and described herein with respect to FIG. 4B.

As shown in FIG. 1C, the CPC package 120 may also include devices 128a-128h (e.g., CPC sockets connected to radio-frequency (RF) copper cable connectors), and the main portion 126 may be configured to support the devices 128a-128h. In some embodiments, and as shown and described herein with respect to FIG. 1E, the CPC substrate 122 may be configured such that when the connector portion 124 is positioned within an MCM socket of an MCM, the main portion 126 extends beyond the peripheral portion of the MCM substrate.

FIG. 1D is a top view of a co-packaged optics (CPO) package 130, in accordance with an embodiment of the invention. In this regard, the CPO package 130 may be a type of mezzanine package referred to with respect to FIGS. 1A and 1B as being electrically connected to and supported by one of the MCM sockets 108a-108h of the MCM 100. As shown in FIG. 1D, the CPO package may include a CPO substrate 132 (e.g., a mezzanine package substrate) including a connector portion 134 and a main portion 136. In some embodiments, the connector portion 134 may be configured to be engaged and supported by an MCM socket of an MCM (e.g., one of the MCM sockets 108a-108h of the MCM 100 of FIGS. 1A and 1B). For example, the connector portion 134 may be similar to a connector portion 424 shown and described herein with respect to FIG. 4B.

As shown in FIG. 1D, the CPO package 130 may also include optical devices 138a-138h, input/output connections 140a-140h, and a power connection 142 each positioned on and/or supported by the main portion 136. In some embodiments, the optical devices 138a-138h may include photonic integrated circuits (PICs) and/or other optical communication devices (e.g., lasers, laser modulators, laser drivers, photo detectors (PD), amplifiers (TIA), and/or the like). The input/output connections 140a-140h (e.g., optical connectors) may be configured to transmit input/output signals between a system PCB and the CPO package 130 and/or the optical devices 138a-138h. The power connection 142 may be configured to receive power for the CPO package 130 (e.g., for the optical devices 138a-138h) from a system PCB. In some embodiments, and as shown and described herein with respect to FIG. 1E, the CPO substrate 132 may be configured such that when the connector portion 134 is positioned within an MCM socket of an MCM, the main portion 136 extends beyond the peripheral portion of the MCM substrate. In this regard, CPC packages may be configured to support copper-based or electrical devices, while CPO packages may be configured to support optics-based or optical devices.

FIG. 1E is a top view of an electronic module 150 including the MCM 100 of FIG. 1A, multiple CPC packages 120a-120d, and multiple CPO packages 130a-130d, in accordance with an embodiment of the invention. In some embodiments, each of the CPC packages 120a-120d may be similar to the CPC package 120 shown and described with respect to FIG. 1C. For example, each of the CPC packages 120a-120d may include a CPC substrate with a connector portion and a main portion as well as one or more devices positioned on the main portion similar to the CPC substrate 122, the connector portion 124, the main portion 126, and the devices 128a-128h of the CPC package 120 of FIG. 1C.

In some embodiments, each of the CPO packages 130a-130d may be similar to the CPO package 130 shown and described with respect to FIG. 1D. For example, each of the CPO packages 130a-130d may include a CPO substrate with a connector portion and a main portion as well as one or more optical devices, input/output connections, and a power connection positioned on the main portion respectively similar to the CPO substrate 132, the connector portion 134, the main portion 136, the optical devices 1328a-138h, the input/output connections 140a-140h, and the power connection 142 of the CPO package 130 of FIG. 1D.

As will be appreciated by one of ordinary skill in the art in view of the present disclosure, the term mezzanine package may refer to a CPC package similar to the CPC package 120 of FIG. 1C or a CPO package similar to the CPO package 130 of FIG. 1D. Furthermore, the term mezzanine package substrate may refer to a CPC substrate similar to the CPC substrate 122 of FIG. 1C or a CPO substrate similar to the CPO substrate 132 of FIG. 1D. In this regard, a mezzanine package may include a mezzanine package substrate and one or more devices positioned on the mezzanine package substrate, where the mezzanine package substrate is configured to support and electrically connect the one or more devices to an MCM. The mezzanine package substrate may include a connector portion and a main portion, where the connector portion is configured to be engaged and supported by an MCM socket and the main portion is configured to extend beyond the peripheral portion of an MCM substrate. The main portion of the mezzanine package substrate may be configured to support the one or more devices. For example, each of the CPC packages 120a-120d and the CPO packages 130a-130d shown in FIG. 1E may be referred to as a mezzanine package, and their substrates may be referred to as mezzanine package substrates.

As shown in FIG. 1E, the electronic module 150 may include four CPC packages 120a-120d and four CPO packages 130a-130d, each engaged with and supported by one of the plurality of MCM sockets 108a-108h of the MCM 100. In this regard, a size and/or shape of the mezzanine package substrates of the CPC packages 120a-120d and the CPO packages 130a-130d may be configured such that the MCM 100 and the plurality of MCM sockets 108a-108h may accommodate a plurality of mezzanine packages. For example, the connector portions and the main portions of the mezzanine package substrates may be configured such that, when the connector portions are positioned on and/or within the plurality of MCM sockets 108a-108h as shown in FIG. 1E, the main portions of the mezzanine package substrates extend beyond the peripheral portion of the MCM substrate 102 and/or do not overlap with each other in a plane parallel to the MCM substrate 102.

In this way, the MCM 100 and the mezzanine packages may permit electronic module designers to increase the number of high-speed channels (e.g., via the MCM sockets instead of the ball grid array), while maintaining signal integrity, and accommodate increased power consumption of high-bandwidth designs without increasing a size of the MCM substrate 102. By avoiding increases to the size of the MCM substrate 102, the MCM 100 and the mezzanine packages may prevent the aforementioned production challenges, such as increased substrate manufacturing yields, substrate warpage, and associated PCB assembly and solderability challenges.

FIG. 1F is a top view of the electronic module 150 of FIG. 1E and an attachment member 146, in accordance with an embodiment of the invention. As shown in FIG. 1E, the attachment member 146 may include a plurality of attachment arms 146a-146d. In some embodiments, the attachment member 146 may be configured to be applied to the connector portions of the mezzanine packages so as to mechanically secure the mezzanine package substrates with respect to the MCM sockets 108a-108h. In some embodiments, and as shown in FIG. 1F, the attachment member 146 may be a contiguous element configured to simultaneously secure a plurality of connector portions of mezzanine package substrates in corresponding MCM sockets. The attachment member 146 is described in greater detail below and may include metal, plastic, and/or the like.

FIG. 1G is a perspective view of an electronic device 160 including the MCM 100 of FIG. 1A, multiple CPC packages 120a-120h, and the attachment member 146, in accordance with an embodiment of the invention. As shown in FIG. 1G, the electronic device 160 also includes a system PCB 152. As compared to the electronic module 150 of FIGS. 1E and 1F, the electronic device 160 of FIG. 1G includes CPC packages but not CPO packages. However, in some embodiments, the electronic device 160 may include combinations of CPC packages and CPO packages or only CPO packages.

Each of the packages 120a-120h may be similar to the CPC package 120 shown and described with respect to FIG. 1C. For example, each of the CPC packages 120a-120h may include a CPC substrate 126a-126h with a connector portion and a main portion as well as one or more devices positioned on the main portion similar to the CPC substrate 122, the connector portion 124, the main portion 126, and the devices 128a-128h of the CPC package 120. As shown in FIG. 1G, the CPC substrates 126a-126h extend beyond the peripheral portion of the MCM substrate of the MCM 100.

As shown in FIG. 1F, the attachment member 146 may be configured to be attached to the system PCB 152 to which the MCM 100 is connected via fasteners 156a-156d (e.g., screws, bolts, pins, and/or the like). For example, and as shown in FIG. 1F, each of the attachment arms 146a-146d may be secured to the system PCB 152 by a respective fastener of the fasteners 156a-156d. In this regard, a fastener may include a narrow shank, which passes through a hole in an attachment arm, and a wider head which engages the attachment arm, such that when the shank is secured to the system PCB 152 the head of the fastener prevents movement of the attachment arm. In some embodiments, and as shown in FIG. 1F, the attachment member 146 may be a contiguous element configured to simultaneously secure a plurality of connector portions of mezzanine package substrates in corresponding MCM sockets. Additionally, or alternatively, the electronic device 160 may include multiple attachment members, where each attachment member secures a single mezzanine package substrate to an MCM socket, where each attachment member secures a subset of mezzanine package substrates (e.g., two, three, four, or more) to respective MCM sockets, and/or the like. For example, in some embodiments, each attachment member may be configured (e.g., sized and shaped) to secure one or more mezzanine package substrates installed in MCM sockets along a single side of the system PCB 152, such that multiple attachment members would be needed to secure mezzanine package substrates that are installed in MCM sockets of different sides of the system PCB (e.g., adjacent or opposite sides of the system PCB).

FIG. 2 is a cross-sectional view of an electronic device 250 including an MCM 200 and a CPC package 220, in accordance with an embodiment of the invention. As shown in FIG. 2, the electronic device 250 may include the MCM 200, the CPC package 220, an attachment member 246, RF cables 248a-248c, a system PCB 252, a support member 254, and electrical interfaces 262a-262c.

In some embodiments, the MCM 200 may be similar to the MCM 100 shown and described herein with respect to FIGS. 1A, 1B, and 1E. For example, and as shown in FIG. 2, the MCM 200 may include an MCM substrate 202, a main die 204, an MCM socket 208, and a BGA 210. The MCM substrate 202, the main die 204, the MCM socket 208, and the BGA 210 may be similar to the MCM substrate 102, the main die 104, one of the plurality of MCM sockets 108a-108h, and the BGA 110, respectively, of FIGS. 1A, 1B, and 1E.

As shown in FIG. 2, the MCM 200 may also include a heat sink 214 and a main die BGA 274. The heat sink 214 may provide thermal dissipation for the main die 204. The main die BGA 274 may be configured to mechanically and electrically connect the main die 204 to the MCM substrate 202. In some embodiments, the main die 204 may be mechanically and electrically connected to the MCM substrate 202 using other structures, such as wire-bonding, and/or the like.

As also shown in FIG. 2, the MCM substrate 202 may include a trace 202a electrically connecting the main die 204 to the system PCB 252. In some embodiments, the MCM substrate 202 may include a plurality of traces similar to trace 202*a* for providing electrical connections between the main die 204 and/or the MCM socket 208 and the system PCB 252.

As shown in FIG. 2, the MCM substrate 202 may include a trace 202*b* electrically connecting the MCM socket 208 to the main die 204. In some embodiments, the MCM substrate 202 may include a plurality of traces similar to trace 202*b* for providing electrical connections between a plurality of MCM sockets and the main die 204 and/or the system PCB 252.

In some embodiments, the CPC package 220 may be similar to the CPC package 120 shown and described herein with respect to FIGS. 1C, 1E, and 1F. For example, and as shown in FIG. 2, the CPC package 220 may include a CPC substrate 222 having a connector portion 224 and a main portion 226. The CPC substrate 222, the connector portion 224, and the main portion 226 may be similar to the CPC substrate 122, the connector portion 124, and the main portion 126, respectively, of FIGS. 1C, 1E, and 1F.

As shown in FIG. 2, the CPC package 220 may include CPC sockets 228*a*-228*h* and CPC connectors 240*a*-240*c* (e.g., RF cable connectors). In this regard, each of the CPC sockets 228*a*-228*h* may mechanically and electrically connect a respective CPC connector of the CPC connectors 240*a*-240*c* to the CPC substrate 222. Furthermore, each CPC socket and its respective CPC connector may be similar to the devices 128*a*-128*f* of the CPC package 120 of FIG. 1C.

As shown in FIG. 2, the CPC substrate 222 may include a trace 222*a* electrically connecting the CPC socket 228*a* to the MCM socket 208. Although not shown in FIG. 2, the CPC substrate 222 may include a plurality of traces similar to trace 222*a* for providing electrical connections between each of the CPC sockets 228*a*-228*c* and the MCM socket 208.

In some embodiments, each of the CPC connectors 240*a*-240*c* may be connected by a respective RF cable of the RF cables 248*a*-248*c* to a respective electrical interface of the electrical interfaces 262*a*-262*c*, as shown in FIG. 2. The electrical interfaces 262*a*-262*c* may include pluggable interfaces (e.g., small form-factor pluggable (SFP) interfaces) for providing electrical connection between the CPC package 220 and other components of the electronic device 250.

As shown in FIG. 2, the attachment member 246 may be configured to be applied to the connector portion 224 of the CPC substrate 222 so as to mechanically secure the CPC substrate 222 with respect to the MCM socket 208. Although not shown in FIG. 2, the attachment member 246 may be configured to be attached to the system PCB 252 (e.g., via one or more fasteners, screws, and/or the like). In some embodiments, the attachment member 246 may be similar to and/or a portion of the attachment member 146 shown and described herein with respect to FIGS. 1F and 1G. For example, the attachment member 246 may be a contiguous element configured to simultaneously secure a plurality of connector portions of mezzanine package substrates in corresponding MCM sockets.

As also shown in FIG. 2, the support member 254 may be configured to be positioned between the main portion 226 of the CPC substrate 222 and the system PCB 252 so as to support the main portion 226 of the CPC substrate 222 with respect to the system PCB 252. In some embodiments, the support member 254 may prevent strain and/or bending of the CPC substrate 222 or dislodgment of the CPC substrate 222 from the MCM socket 208. Additionally, or alternatively, the support member 254 may be configured to be positioned between multiple mezzanine package substrates and the system PCB 252 and simultaneously support the main portions of the mezzanine package substrates with respect to the system PCB 252. In some embodiments, the support member 254 may include metal, plastic, and/or the like as well as one or more elastomeric elements, such as cushions, to absorb vibrations.

FIG. 3A is a cross-sectional view of an electronic device 350*a* including an MCM 300 and a CPO package 330*a*, in accordance with an embodiment of the invention. As shown in FIG. 3A, the electronic device 350*a* may include the MCM 300, the CPO package 330*a*, an attachment member 346, optical cables 348*a*-348*b*, a system PCB 352, a support member 354, a power connection 356, a power cable 358, and optical interfaces 360*a*-360*b*.

In some embodiments, the MCM 300 may be similar to the MCM 100 shown and described herein with respect to FIGS. 1A, 1B, and 1E. For example, and as shown in FIG. 3A, the MCM 300 may include an MCM substrate 302, a main die 304, an MCM socket 308, and a BGA 310. The MCM substrate 302, the main die 304, the MCM socket 308, and the BGA 310 may be similar to the MCM substrate 102, the main die 104, one of the plurality of MCM sockets 108*a*-108*h*, and the BGA 110, respectively, of FIGS. 1A, 1B, and 1E.

As shown in FIG. 3A, the MCM 300 may also include a heat sink 314 and a main die BGA 374. The heat sink 314 may provide thermal dissipation for the main die 304. The main die BGA 374 may be configured to mechanically and electrically connect the main die 304 to the MCM substrate 302. In some embodiments, the main die 304 may be mechanically and electrically connected to the MCM substrate 302 using other structures, such as wire-bonding, and/or the like.

As also shown in FIG. 3A, the MCM substrate 302 may include a trace 302*a* electrically connecting the main die 304 to the system PCB 352. In some embodiments, the MCM substrate 302 may include a plurality of traces similar to trace 302*a* for providing electrical connections between the main die 304 and/or the MCM socket 308 and the system PCB 352.

As shown in FIG. 3A, the MCM substrate 302 may include a trace 302*b* electrically connecting the MCM socket 308 to the main die 304. In some embodiments, the MCM substrate 302 may include a plurality of traces similar to trace 302*b* for providing electrical connections between a plurality of MCM sockets and the main die 304 and/or the system PCB 352.

In some embodiments, the CPO package 330*a* may be similar to the CPO package 130 shown and described herein with respect to FIGS. 1D-1F. For example, and as shown in FIG. 3A, the CPO package 330*a* may include a CPO substrate 332 having a connector portion 334 and a main portion 336. The CPO substrate 332, the connector portion 334, and the main portion 336 may be similar to the CPO substrate 132, the connector portion 134, and the main portion 136, respectively, of FIGS. 1D-1F.

As shown in FIG. 3A, the CPO package 330*a* may include optical devices 338*a*-338*b* (e.g., PICs) and optical connectors 340*a*-340*b* (e.g., optical cable connectors). In this regard, each of the optical devices 338*a*-338*b* may be optically and/or mechanically connected a respective optical connector of the optical connectors 340*a*-340*b*. Furthermore, each of the optical devices 338*a*-338*b* may be similar to the optical devices 138*a*-138*h* of the CPO package 130 of FIG. 1D. Additionally, each of the optical connectors 340*a*-340*b* may be similar to the input/output connections 140*a*-140*h* of the CPO package 130 of FIG. 1D.

As also shown in FIG. 3A, the CPO package 330*a* may include heat sinks 344*a*-344*b* for the optical devices 338*a*-338*b*, respectively. Each of the heat sinks 344*a*-344*b* may provide thermal dissipation for a corresponding optical device of the optical devices 338*a*-338*b*.

As shown in FIG. 3A, the CPO substrate 332 may include a trace 332*a* electrically connecting the optical device 338*a* to the MCM socket 308. Although not shown in FIG. 3A, the CPO substrate 332 may include a plurality of traces similar to trace 332*a* for providing electrical connections between each of the optical devices 338*a*-338*b* and the MCM socket 308.

In some embodiments, each of the optical connectors 340*a*-340*b* may be connected by a respective optical cable of the optical cables 348*a*-348*b* to a respective optical interface of the optical interfaces 360*a*-360*b*, as shown in FIG. 3A. The optical interfaces 360*a*-360*b* may include pluggable interfaces for providing optical connections between the CPO package 320 and other components of the electronic device 350*a*.

As shown in FIG. 3A, the CPO package 330*a* may include a power connection 342. The power connection 342 may be similar to the power connection 142 of the CPO package 130 of FIG. 1D. However, as shown in FIG. 3A, the power connection 342 may be disposed on an opposite side of the CPO substrate 332 from the optical devices 338*a*-338*b*, rather than on the same side of the CPO substrate 132 as the optical devices 138*a*-138*h* as shown in FIG. 1D. As shown in FIG. 3A, the power connection 342 may be connected to another power connection 356 on the system PCB 352 via the power cable 358. In this regard, the power connection 342 may be configured to receive power for the CPO package 330 (e.g., for powering the optical devices 338*a*-338*b*) from the power connection 356 on the system PCB 352 via the power cable 358.

As shown in FIG. 3A, the attachment member 346 may be configured to be applied to the connector portion 334 of the CPO substrate 332 so as to mechanically secure the CPO substrate 332 with respect to the MCM socket 308. Although not shown in FIG. 3A, the attachment member 346 may be configured to be attached to the system PCB 352 (e.g., via one or more screws and/or the like). In some embodiments, the attachment member 346 may be similar to and/or a portion of the attachment member 146 shown and described herein with respect to FIGS. 1F and 1G. For example, the attachment member 346 may be a contiguous element configured to simultaneously secure a plurality of connector portions of mezzanine package substrates in corresponding MCM sockets.

As also shown in FIG. 3A, the support member 354 may be configured to be positioned between the main portion 336 of the CPO substrate 332 and the system PCB 352 so as to support the main portion 336 of the CPO substrate 332 with respect to the system PCB 352. In some embodiments, the support member 354 may prevent strain and/or bending of the CPO substrate 332 or dislodgment of the CPO substrate 332 from the MCM socket 308. Additionally, or alternatively, the support member 354 may be configured to be positioned between multiple mezzanine package substrates and the system PCB 352 and may serve to simultaneously support the main portions of the mezzanine package substrates with respect to the system PCB 352.

FIG. 3B is a cross-sectional view of an electronic device 350*b* including an MCM 300 and another CPO package 330*b*, in accordance with an embodiment of the invention. The electronic device 350*b* and the MCM 300 of FIG. 3B may be similar to the electronic device 350*a* and the MCM 300 of FIG. 3A. However, as shown in FIG. 3B, the optical devices 338*a*-338*b* (e.g., PICs) and the optical connectors 340*a*-340*b* (e.g., optical cable connectors) are positioned on a surface of the main portion 336 of the CPO substrate 332 oriented toward the system PCB 352 when the connector portion 334 of the CPO substrate 332 is positioned in the MCM socket 308.

Stated differently, the optical devices 338*a*-338*b* and the optical connectors 340*a*-340*b* are positioned on the main portion 336 of the CPO substrate 332 between the CPO substrate 332 and the system PCB 352 when the connector portion 334 of the CPO substrate 332 is positioned in the MCM socket 308. Furthermore, the optical devices 338*a*-338*b* and the optical connectors 340*a*-340*b* are positioned on a same surface of the CPO substrate 332 as electrical connections between the CPO substrate 332 and the MCM socket 308.

By positioning the optical devices 338*a*-338*b* and the optical connectors 340*a*-340*b* in this manner, the CPO substrate 332 of CPO package 330*b* may not require traces through the CPO substrate 332 (e.g., similar to the trace 332*a* of CPO package 330*a*) for electrically connecting the optical devices 338*a*-338*b* to the MCM socket 308. By omitting such traces, the CPO package 330*b* may provide improved signal integrity of the electrical connections between the optical devices 338*a*-338*b* and the main die 304 and/or the system PCB 352.

Although not shown in FIG. 3B, the electronic device 350*b* may also include a support member similar to the support member 354 as shown and described with respect to FIG. 3A. Additionally, or alternatively, the optical devices 338*a*-338*b*, the optical connectors 340*a*-340*b*, and/or the heat sinks 344*a*-344*b* may be configured to be positioned between the main portion 336 of the CPO substrate 332 and the system PCB 352 and support the main portion 336 of the CPO substrate 332 with respect to the system PCB 352. For example, the optical devices 338*a*-338*b*, the optical connectors 340*a*-340*b*, and/or the heat sinks 344*a*-344*b* may be configured (e.g., sized and shaped) to interface with a surface of the system PCB 352, such that the optical devices, the optical connectors, and/or the heat sinks themselves serve as a "support member." Optical devices 338*a*-338*b*, optical connectors 340*a*-340*b*, and/or heat sinks 344*a*-344*b* configured in such a manner may prevent strain and/or bending of the CPO substrate 332 or dislodgment of the CPO substrate 332 from the MCM socket 308.

FIG. 4A is a perspective view of a socket 400 for an MCM, in accordance with an embodiment of the invention. As shown in FIG. 4A, the socket 400 may include a socket frame 402 and a socket pin array 404. The socket frame 402 may define a peripheral access opening 406, and the socket pin array 404 may include a plurality of pins 408.

In some embodiments, the socket 400 may be one or more of the MCM sockets 108*a*-108*h* shown and described herein with respect to FIGS. 1A and 1E. For example, the peripheral access opening 406 may be configured to receive a connector portion of a mezzanine package substrate and/or allow a main portion of the mezzanine package substrate to extend beyond an edge of the socket 400. As another example, the socket pin array 404 and/or the plurality of pins 408 may be configured to engage a surface of an MCM substrate and electrically connect a mezzanine package substrate to a main die on the MCM substrate (e.g., via one or more electrical traces of the MCM substrate). For example, the socket pin array 404 and/or the plurality of pins 408 may be configured to engage a bottom surface of a connector portion of a mezzanine package including a corresponding contact array and/or a corresponding plurality of contacts (e.g., similar to the connector portion, contact array, and/or plurality of contacts shown and described herein with respect to FIG. 4B).

In some embodiments, a pitch of the socket pin array 404 (e.g., a minimum distance between adjacent pins of the plurality of pins 408) may be less than a pitch of a BGA of the MCM on which it is positioned. For example, in an embodiment in which the socket 400 is one of the MCM sockets 108a-108h of the MCM 100, the pitch of the socket pin array 404 may be less than a pitch of the BGA 110 (e.g., a minimum distance between adjacent solder balls 112 of the BGA 110). Such embodiments may require less surface area on the MCM substrate 102 for the socket 400 to establish electrical connections between the mezzanine package and the MCM 100 as compared to conventional sockets.

FIG. 4B is a bottom view of a connector portion 424 of a mezzanine package substrate, in accordance with an embodiment of the invention. As shown in FIG. 4B, the connector portion 424 may include a contact array 414 including a plurality of contacts 418. Each contact of the plurality of contacts 418 may include a surface (e.g., a metallic surface) configured to engage a corresponding pin of a socket pin array of an MCM socket (e.g., a pin of the socket pin array 404 of the socket 400 of FIG. 4A).

In some embodiments, the connector portion 424 may be the connector portion 124 of the CPC package substrate 122 of FIG. 1C, the connector portion 134 of the CPO package substrate 132 of FIG. 1D, and/or a connector portion of any other mezzanine package substrate described herein. In this regard, the bottom view of FIG. 4B shows the surface of the connector portion 424 that interfaces with and engages an MCM socket on an MCM and electrically connects the MCM socket to the mezzanine package substrate. For example, the contact array 414 and/or the plurality of contacts 418 may be configured to engage an upper surface of a socket including a socket pin array and/or a plurality of pins (e.g., similar to the socket 400, socket pin array 404, and/or plurality of pins 408 shown and described herein with respect to FIG. 4A). As another example, the connector portion 424 may be configured (e.g., by having a shape and/or a size) to fit within a peripheral access opening defined by a frame of a socket (e.g., similar to the peripheral access opening 406 defined by the socket frame 402 of the socket 400 shown and described herein with respect to FIG. 4A).

FIG. 5 is a flowchart illustrating a method 500 of assembling an electronic device, in accordance with an embodiment of the invention. In some embodiments, the electronic device may be similar to one or more of the electronic modules and/or electronic devices described herein, such as the electronic module 150 of FIGS. 1E and 1F, the electronic device 250 of FIG. 2, the electronic device 350a of FIG. 3A, and/or the electronic device 350b of FIG. 3B.

As shown in block 502, the method 500 may include providing a multi-chip module (MCM). The MCM may include (i) an MCM substrate having a first surface and a second surface opposite the first surface, where the second surface defines a central portion and a peripheral portion and the MCM substrate includes electrical traces, and (ii) a main die positioned on the central portion of the second surface and in electrical communication with the electrical traces. For example, the MCM may be similar to the MCM 100 of FIGS. 1A, 1B, 1E, and 1F, the MCM 200 of FIG. 2, and/or the MCM 300 of FIGS. 3A and 3B.

As shown in block 504, the method 500 may include disposing a plurality of MCM sockets on the peripheral portion of the MCM substrate, where each MCM socket of the plurality of MCM sockets is in electrical communication with the electrical traces of the MCM substrate. For example, the plurality of MCM sockets may be similar to the plurality of MCM sockets 108a-108h of FIGS. 1A, 1E, and 1F, the MCM socket 208 of FIG. 2, the MCM socket 308 of FIGS. 3A and 3B, and/or the socket 400 of FIG. 4A.

As shown in block 506, the method 500 may include mechanically and electrically connecting the first surface of the MCM substrate to a system printed circuit board (PCB). For example, the system PCB may be similar to the system PCB 252 of FIG. 2 and/or the system PCB 352 of FIGS. 3A and 3B. In some embodiments, mechanically and electrically connecting the first surface of the MCM to the system PCB may include reflow soldering a ball grid array (BGA) on the first surface of the MCM (e.g., similar to the BGA 110 of FIG. 1B, the BGA 210 of FIG. 2, and/or the BGA 310 of FIGS. 3A and 3B).

As shown in block 508, the method 500 may include engaging a mezzanine package with a first MCM socket of the plurality of MCM sockets. The mezzanine package may include a mezzanine package substrate that includes (i) a connector portion for engaging the first MCM socket and (ii) a main portion extending beyond the peripheral portion of the MCM substrate, where the main portion is configured to support one or more devices in electrical communication with the MCM substrate via the first MCM socket. For example, the mezzanine package may be similar to the CPC package 120 of FIG. 1C, the CPC packages 120a, 120b, 120c, and 120d of FIGS. 1E and 1F, the CPC package 220 of FIG. 2, the CPO package 130 of FIG. 1D, the CPO packages 130a, 130b, 130c, and 130d of FIGS. 1E and 1F, the CPO package 330a of FIG. 3A, and/or the CPO package 330b of FIG. 3B.

In some embodiments, engaging the mezzanine package with the first MCM socket may include applying an attachment member to the connector portion of the mezzanine package substrate and/or securing the attachment member to the system PCB, where the connector portion of the mezzanine package substrate is disposed between the attachment member and the first MCM socket. For example, the attachment member may be similar to the attachment member 146 of FIGS. 1F and 1G, the attachment member 246 of FIG. 2, and/or the attachment member 346 of FIGS. 3A and 3B. In some embodiments, securing the attachment member to the system PCB may include securing attachment arms of the attachment member (e.g., similar to the attachment arms 146a-146d of FIG. 1F) to the system PCB.

In some embodiments, the mezzanine package is a first mezzanine package, and the mezzanine package substrate is a first mezzanine package substrate. In such embodiments, the method 500 may include engaging a second mezzanine package with a second MCM socket of the plurality of MCM sockets, where the second mezzanine package includes a second mezzanine package substrate that includes (i) a connector portion for engaging the second MCM socket and (ii) a main portion extending beyond the peripheral portion of the MCM substrate, where the main portion is configured to support one or more devices in electrical communication with the MCM substrate via the second MCM socket. For example, the first mezzanine package may be a CPC package, and the second mezzanine package may be a CPO package.

Additionally, or alternatively, the method 500 may include engaging additional mezzanine packages with the other MCM sockets of the plurality of MCM sockets such that each MCM socket of the plurality of MCM sockets is engaged by a respective mezzanine package. The mezzanine packages may include only CPC packages, only CPO packages, or combinations of any number of CPC packages with any number of CPO packages as permitted by a number of MCM sockets on the MCM substrate.

As shown in block 510, the method 500 may include attaching the MCM and the mezzanine package to the system PCB with a mechanical enclosure. For example, the method 500 may include using an attachment member (e.g., similar to the attachment member 146, the attachment member 246, the attachment member 346, and/or the like) and/or a support member (e.g., similar to the support member 254, the support member 354, and/or the like) to attach the MCM and the mezzanine package to the system PCB.

Method 500 may include additional embodiments, such as any single embodiment or any combination of embodiments described herein. Although FIG. 5 shows example blocks of method 500, in some embodiments, method 500 may include additional blocks, fewer blocks, different blocks, or differently arranged blocks than those depicted in FIG. 5. Additionally, or alternatively, two or more of the blocks of method 500 may be performed in parallel.

As will be appreciated by one of ordinary skill in the art in view of this disclosure, the present invention may include and/or be embodied as an apparatus (including, for example, a system, a machine, an device, and/or the like), as a method (including, for example, a manufacturing method, a robot-implemented process, and/or the like), or as any combination of the foregoing.

Although many embodiments of the present invention have just been described above, the present invention may be embodied in many different forms and should not be construed as limited to the embodiments set forth herein; rather, these embodiments are provided so that this disclosure will satisfy applicable legal requirements. Also, it will be understood that, where possible, any of the advantages, features, functions, devices, and/or operational aspects of any of the embodiments of the present invention described and/or contemplated herein may be included in any of the other embodiments of the present invention described and/or contemplated herein, and/or vice versa.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other changes, combinations, omissions, modifications, and substitutions, in addition to those set forth in the above paragraphs, are possible. Those skilled in the art will appreciate that various adaptations, modifications, and combinations of the just described embodiments may be configured without departing from the scope and spirit of the invention. For example, devices, modules, components, and/or elements shown in the figures are not necessarily drawn to scale and may vary from that shown without departing from the scope and spirit of the invention. Therefore, it is to be understood that, within the scope of the appended claims, the invention may be practiced other than as specifically described herein.

What is claimed is:

1. An electronic module, comprising:
a multi-chip module (MCM) substrate having (i) a first surface comprising a ball grid array (BGA) configured to be connected to a system printed circuit board (PCB) and (ii) a second surface opposite the first surface, wherein the second surface defines a central portion and a peripheral portion, and wherein the MCM substrate comprises electrical traces;
a main die positioned on the central portion of the second surface of the MCM substrate and in electrical communication with the electrical traces; and
a plurality of MCM sockets positioned on the peripheral portion of the MCM substrate, wherein each MCM socket of the plurality of MCM sockets is in electrical communication with the electrical traces of the MCM substrate and is configured to:
engage and support a mezzanine package substrate via a connector portion of the mezzanine package substrate such that a main portion of the mezzanine package substrate extends beyond the peripheral portion of the MCM substrate, wherein the main portion of the mezzanine package substrate is larger than the connector portion of the mezzanine package substrate; and
electrically connect the mezzanine package substrate to the main die via at least one of the electrical traces of the MCM substrate.

2. The electronic module of claim 1, wherein each MCM socket of the plurality of MCM sockets comprises:
a socket frame defining a peripheral access opening that is configured to allow the main portion of the mezzanine package substrate to extend beyond an edge of the MCM socket; and
a socket pin array within the socket frame and configured to engage the second surface of the MCM substrate and electrically connect the mezzanine package substrate to the main die via at least one of the electrical traces of the MCM substrate.

3. The electronic module of claim 2, wherein a pitch of the BGA is greater than a pitch of the socket pin array.

4. The electronic module of claim 1, further comprising an attachment member configured to be applied to a connector portion of at least one mezzanine package substrate so as to mechanically secure the at least one of the mezzanine package substrate with respect to a corresponding one of the plurality of MCM sockets, wherein the attachment member is configured to be attached to the system PCB.

5. The electronic module of claim 4, wherein the attachment member is a contiguous element configured to simultaneously secure a plurality of connector portions of mezzanine package substrates in the corresponding plurality of MCM sockets.

6. The electronic module of claim 1, wherein the plurality of MCM sockets is configured to electrically connect high speed signal pins and ground isolation pins of mezzanine package substrates to the electrical traces of the MCM substrate.

7. An electronic module, comprising:
a multi-chip module (MCM) comprising:
an MCM substrate having (i) a first surface comprising a ball grid array (BGA) configured to be connected to a system printed circuit board (PCB) and (ii) a second surface opposite the first surface, wherein the second surface defines a central portion and a peripheral portion, and wherein the MCM substrate comprises electrical traces;
a main die positioned on the central portion of the MCM substrate and in electrical communication with the electrical traces; and
a plurality of MCM sockets positioned on the peripheral portion of the MCM substrate, wherein each MCM socket of the plurality of MCM sockets is in electrical communication with the electrical traces of the MCM substrate; and a mezzanine package comprising a mezzanine package substrate comprising (i) a connector portion engaged and supported by a first MCM socket of the plurality of MCM sockets and (ii) a main portion extending beyond the peripheral portion of the MCM substrate, wherein the main portion of the mezzanine package substrate is larger than the connector portion of the mezzanine package substrate and wherein the main portion is configured to support one or more devices and electrically connect the one or more devices with the MCM substrate via the first MCM socket.

8. The electronic module of claim 7, wherein the mezzanine package is:

a co-packaged copper (CPC) package, wherein the one or more devices comprise one or more radio-frequency copper cable connectors; or a co-packaged optics (CPO) package, wherein the one or more devices comprise one or more optical devices.

9. The electronic module of claim 7, wherein the mezzanine package is a first mezzanine package, wherein the mezzanine package substrate is a first mezzanine package substrate, and wherein the electronic module comprises a second mezzanine package comprising:

a second mezzanine package substrate comprising (i) a connector portion engaged and supported by a second MCM socket of the plurality of MCM sockets and (ii) a main portion extending beyond the peripheral portion of the MCM substrate, wherein the main portion is configured to support one or more devices and electrically connect the one or more devices with the MCM substrate via the second MCM socket.

10. The electronic module of claim 9, wherein:

the first mezzanine package is a co-packaged copper (CPC) package; and the second mezzanine package is a co-packaged optics (CPO) package.

11. The electronic module of claim 7, wherein the mezzanine package is a co-packaged optics (CPO) package comprising a power connection positioned on the main portion of the mezzanine package substrate, and wherein the power connection is configured to receive power for the CPO package from the system PCB.

12. The electronic module of claim 7, wherein the mezzanine package is a co-packaged optics (CPO) package comprising an input/output connection positioned on the main portion of the mezzanine package substrate, and wherein the input/output connection is configured to transmit input/output signals between the CPO package and the system PCB.

13. The electronic module of claim 7, wherein the mezzanine package is a co-packaged optics (CPO) package, wherein the main portion of the mezzanine package substrate is configured to support the one or more devices on a first surface of the mezzanine package substrate, and wherein the first surface of the mezzanine package substrate is oriented toward the system PCB when the connector portion of the mezzanine package is positioned within the first MCM socket.

14. The electronic module of claim 7, comprising a support member disposed beyond the peripheral portion of the MCM substrate and configured to be positioned between the main portion of the mezzanine package substrate and the system PCB and to support the main portion of the mezzanine package substrate with respect to the system PCB.

15. The electronic module of claim 7, wherein the mezzanine package is a co-packaged optics (CPO) package, and wherein the one or more devices comprise a plurality of photonic integrated circuits (PICs).

16. The electronic module of claim 15, wherein the CPO package comprises, for each PIC of the plurality of PICs, an optical connector.

17. A method of assembling an electronic device, the method comprising:

providing a multi-chip module (MCM) comprising (i) an MCM substrate having a first surface and a second surface opposite the first surface, wherein the second surface defines a central portion and a peripheral portion, and wherein the MCM substrate comprises electrical traces, and (ii) a main die positioned on the central portion of the second surface and in electrical communication with the electrical traces;

disposing a plurality of MCM sockets on the peripheral portion of the MCM substrate, wherein each MCM socket of the plurality of MCM sockets is in electrical communication with the electrical traces of the MCM substrate;

mechanically and electrically connecting the first surface of the MCM substrate to a system printed circuit board (PCB); and engaging a mezzanine package with a first MCM socket of the plurality of MCM sockets, wherein the mezzanine package comprises a mezzanine package substrate comprising (i) a connector portion for engaging the first MCM socket and (ii) a main portion extending beyond the peripheral portion of the MCM substrate, wherein the main portion of the mezzanine package substrate is larger than the connector portion of the mezzanine package substrate and wherein the main portion is configured to support one or more devices in electrical communication with the MCM substrate via the first MCM socket.

18. The method of claim 17, wherein mechanically and electrically connecting the first surface of the MCM to the system PCB comprises reflow soldering a ball grid array on the first surface of the MCM.

19. The method of claim 17, wherein engaging the mezzanine package with the first MCM socket comprises:

applying an attachment member to the connector portion of the mezzanine package substrate; and securing the attachment member to the system PCB, wherein the connector portion of the mezzanine package substrate is disposed between the attachment member and the first MCM socket.

20. The method of claim 17, wherein the mezzanine package is a first mezzanine package, and wherein the mezzanine package substrate is a first mezzanine package substrate, and wherein the method further comprises:

engaging a second mezzanine package with a second MCM socket of the plurality of MCM sockets, wherein the second mezzanine package comprises a second mezzanine package substrate comprising (i) a connector portion for engaging the second MCM socket and (ii) a main portion extending beyond the peripheral portion of the MCM substrate, wherein the main portion is configured to support one or more devices in electrical communication with the MCM substrate via the second MCM socket.

* * * * *